United States Patent [19]
Kobayashi

[11] Patent Number: 5,689,456
[45] Date of Patent: Nov. 18, 1997

[54] SEMICONDUCTOR NON-VOLATILE FERROELECTRIC MEMORY TRANSISTOR ACCOMPANIED WITH CAPACITOR FOR INCREASING POTENTIAL DIFFERENCE APPLIED TO FERROELECTRIC LAYER

[75] Inventor: Sota Kobayashi, Tokyo, Japan

[73] Assignee: NEC Corporation, Tokyo, Japan

[21] Appl. No.: 745,848

[22] Filed: Nov. 12, 1996

[30] Foreign Application Priority Data

Nov. 10, 1995 [JP] Japan ................... 7-317262

[51] Int. Cl.⁶ .................................................. G11C 11/22
[52] U.S. Cl. ........................... 365/145; 365/149; 257/295
[58] Field of Search ...................................... 365/145, 149, 365/117; 257/295

[56] References Cited

U.S. PATENT DOCUMENTS

| | | | |
|---|---|---|---|
| 5,517,445 | 5/1996 | Imai et al. ................ | 365/145 |
| 5,541,870 | 7/1996 | Mihara et al. ............. | 365/145 |
| 5,559,733 | 9/1996 | McMillan et al. ......... | 365/145 |
| 5,579,257 | 11/1996 | Ta ............................. | 365/145 |

FOREIGN PATENT DOCUMENTS

| | | |
|---|---|---|
| 50-82973 | 7/1975 | Japan . |
| 629549 | 2/1994 | Japan . |

Primary Examiner—Do Hyun Yoo

[57] ABSTRACT

A semiconductor non-volatile ferroelectric memory transistor has a lower paraelectric capacitor for creating a conductive channel between a source region and a drain region and an upper ferroelectric capacitor stacked on the lower paraelectric capacitor for storing a data bit in the form of remanence in a ferroelectric layer, and a paraelectric capacitor is connected between the channel region and the upper electrode of the lower paraelectric capacitor so as to increase a potential difference applied across the ferroelectric layer, thereby improving information storing characteristics.

8 Claims, 9 Drawing Sheets

SEMICONDUCTOR NON-VOLATILE FERROELECTRIC MEMORY TRANSISTOR ACCOMPANIED WITH CAPACITOR FOR INCREASING POTENTIAL DIFFERENCE APPLIED TO FERROELECTRIC LAYER

FIELD OF THE INVENTION

This invention relates to a semiconductor non-volatile ferroelectric memory transistor and, more particularly, to a semiconductor ferroelectric memory transistor accompanied with a capacitor for increasing a potential difference applied to the ferroelectric layer of the semiconductor non-volatile ferroelectric memory transistor.

DESCRIPTION OF THE RELATED ART

A typical example of the semiconductor non-volatile ferroelectric memory transistor is disclosed in Japanese patent Publication of Unexamined Application No. 50-82973, and FIG. 1 illustrates the structure of the prior art semiconductor non-volatile ferroelectric memory transistor disclosed in the Japanese Patent Publication of Unexamined Application.

The prior art semiconductor non-volatile ferroelectric memory transistor is fabricated on a semiconductor substrate 1. A source region 1a and a drain region 1b are formed in a surface portion of the semiconductor substrate 1, and are spaced from each other. A gate insulating layer 2 covers a channel region 1c between the source region 1a and the drain region 1b, and is formed of ferroelectric material such as $(Pb(Zr, Ti)O_3)$ abbreviated as "PZT". The gate insulating layer 2 is overlain by a gate electrode 3, and a potential applied to the gate electrode creates an electric field across the gate insulating layer so as to give rise to a polarization in the ferroelectric material.

The ferroelectric material has a polarization hysteresis, and the remanence is in dependence on the electric field applied thereto. The remanence provides polarized charge to the channel region 1c, and affects the density of electric charge in the boundary between the gate insulating layer 2 and the semiconductor substrate 1. When the electric charge is distributed at high density, a conductive channel takes place between the source region 1a and the drain region 1b, and current flows between the source region 1a and the drain region 1b. On the other hand, when the remanence provides only a negligible amount of polarized charge, the channel region 1c isolates the source region 1a from the drain region 1b.

Even if the potential is removed from the gate electrode 3, the gate insulating layer 2 of the ferroelectric material maintains the remanence due to the polarization hysteresis, and continuously affects the channel region 1c. Thus, the prior art semiconductor non-volatile ferroelectric memory transistor is able to selectively take two kinds of polarized state, and the two kinds of polarized state are available for two logic levels of a stored data bit.

The prior art semiconductor non-volatile ferroelectric memory transistor is not feasible, because the ferroelectric layer 2 increases the surface state in the channel region 1c.

Japanese Patent Publication of Unexamined Application No. 6-29549 proposes a solution of the problem encountered in the prior art semiconductor non-volatile ferroelectric memory transistor shown in FIG. 1. FIG. 2 illustrates the semiconductor non-volatile ferroelectric memory transistor disclosed in Japanese Patent Publication of Unexamined Application No. 6-29549.

The semiconductor non-volatile ferroelectric memory transistor is fabricated on a p-type silicon substrate 10, and an n-type source region 10a and an n-type drain region 10b are spaced in a surface portion of the p-type silicon substrate 10 from one another. A channel region 10c takes place between the n-type source region 10a and the n-type drain region 10b, and a silicon dioxide layer 11a is grown on the channel region 10c. A ferroelectric layer 11b is laminated on the silicon dioxide layer 11a, and the silicon dioxide layer 11a and the ferroelectric layer 11b form in combination a gate insulating structure 11. The gate insulating structure 11 is overlain by a gate electrode 12, and a potential level at the gate electrode 12 creates an electric field across the gate structure 11.

The ferroelectric layer 11b is polarized in the presence of an electric field created by the potential at the gate electrode 12, and generates the polarized charge. The amount of polarized charge is in dependence on the strength of the electric field, and the silicon dioxide layer 11a induces electric charge in the channel region 10c due to the polarized charge. When the potential is removed from the gate electrode 12, the remanence is left in the ferroelectric layer 11b, and the remanence still controls the amount of electric charge accumulated in the channel region through the silicon dioxide layer 11a, and the prior art semiconductor non-volatile ferroelectric memory transistor stores a data bit in the form of polarized state of the ferroelectric layer 11b.

It is well known to a person skilled in the art that the silicon dioxide grown on the channel region 10c improves the surface state of the channel region 10c, and a user easily controls the conductive channel of the semiconductor non-volatile ferroelectric memory transistor shown in FIG. 2.

However, a problem is encountered in the prior art semiconductor non-volatile ferroelectric memory transistor in that difference in the magnitude of remanence between two kinds of polarized state is small. In other words, the semiconductor non-volatile ferroelectric memory transistor has a problem in the information storing characteristics.

SUMMARY OF THE INVENTION

It is therefore an important object of the present invention to provide a semiconductor non-volatile ferroelectric memory transistor which is improved in information storing characteristics without sacrifice of surface state.

The present inventor contemplated the problem, and analyzed the prior art semiconductor non-volatile ferroelectric memory transistor. FIG. 3 illustrated an equivalent circuit of the prior art semiconductor non-volatile ferroelectric memory transistor shown in FIG. 2. The silicon dioxide layer 11a and the ferroelectric layer 11b inserted between the channel region 10c and the gate electrode 12 were equivalent to a series of a ferroelectric capacitor CP1 and a paraelectric capacitor CP2.

In the following description, term "paraelectric material" means dielectric material without a remanence after an application of an electric field, and typical examples of the paraelectric material are silicon oxide and silicon nitride. The ferroelectric capacitor CP1 had a dielectric film of ferroelectric material inserted between two electrodes, and the paraelectric capacitor CP2 had a dielectric film of paraelectric material inserted between two electrodes. The ferroelectric capacitor CP1 and the paraelectric capacitor CP2 were assumed to have capacitances Cf and Cg, respectively.

When potential difference V was applied between the series of ferroelectric capacitor CP1 and paraelectric capacitor CP2, part Vf of the potential difference V was applied to the ferroelectric capacitor CP1, and was given by equation 1.

$$Vf = Cg \times V/(Cf+Cg) \qquad \text{Equation 1}$$

The capacitance Cf is much larger than the capacitance Cg, and equation 1 was approximated as equation 2.

$$Vf = Cg \times V/Cf \qquad \text{Equation 2}$$

Ferroelectric material had a relative permittivity much larger than those of silicon oxide and silicon nitride. For example, the relative permittivity of PZT was of the order of 600. The relative permittivity of silicon dioxide was only 4, and silicon nitride, i.e., $Si_3N_4$ has the relative permittivity of the order of 7.

The capacitance C was given by equation 3.

$$C = e_r \times e_0 \times S/d \qquad \text{Equation 3}$$

where $e_r$ is the relative permittivity, $e_0$ is the permittivity in vacuum, S is the cross section of the dielectric film and d is the thickness of the dielectric film. If the ferroelectric capacitor CP1 was equal in dimensions to the paraelectric capacitor CP2, the capacitance Cg was much smaller than the capacitance Cf. Turning to equation 2, the numerator Cg was much smaller than the denominator Cf. For this reason, the potential difference Vf applied to the ferroelectric capacitor CP1 was quite little rather than the potential difference applied to the paraelectric capacitor CP2.

While the semiconductor non-volatile ferroelectric memory transistor shown in FIG. 2 was maintaining a data bit, the gate electrode 12 was maintained at zero volt, and only the remanence maintained the data bit. The remanence was gradually decreased with time. For this reason, it was preferable to enlarge the remanence initially generated in the ferroelectric layer 11b. The larger the potential difference was applied to the ferroelectric capacitor CP1, the larger the initial remanence was. However, most of the potential difference V was applied to the paraelectric capacitor CP2, and only a small amount of potential difference Vf was applied to the ferroelectric capacitor CP1. The small potential difference Vf merely generated a small amount of remanence, and, for this reason, the prior art semiconductor non-volatile ferroelectric memory transistor had poor information storing characteristics. Thus, the present inventor concluded that the large difference in capacitance between the ferroelectric capacitance Cf and the paraelectric capacitance Cg deteriorated the information storing characteristics of the prior art semiconductor non-volatile ferroelectric memory transistor.

To accomplish the object, the present invention proposes to increase the ratio of potential applied to a ferroelectric layer to potential applied to a paraelectric layer.

In accordance with the present invention, there is provided a semiconductor non-volatile ferroelectric memory cell fabricated on a semiconductor substrate, comprising: a memory transistor including source and drain regions formed on both sides of a channel region, a lower gate insulating layer of paraelectric material formed on the channel region, a lower gate electrode laminated on the lower gate insulating layer, an upper gate insulating layer formed of ferroelectric material on the lower gate electrode and an upper gate electrode formed on the upper gate insulating layer, and storing a data bit in the form of remanence in the upper gate insulating layer; and a paraelectric capacitor including a lower electrode electrically connected to the channel region, an insulating layer formed of paraelectric material on the lower electrode and an upper electrode electrically connected to the lower gate electrode of the memory transistor.

BRIEF DESCRIPTION OF THE DRAWINGS

The features and advantages of the semiconductor non-volatile ferroelectric memory transistor according to the present invention will be more clearly understood from the following description taken in conjunction with the accompanying drawings in which.

DESCRIPTION OF THE PREFERRED EMBODIMENTS

Figure 4:
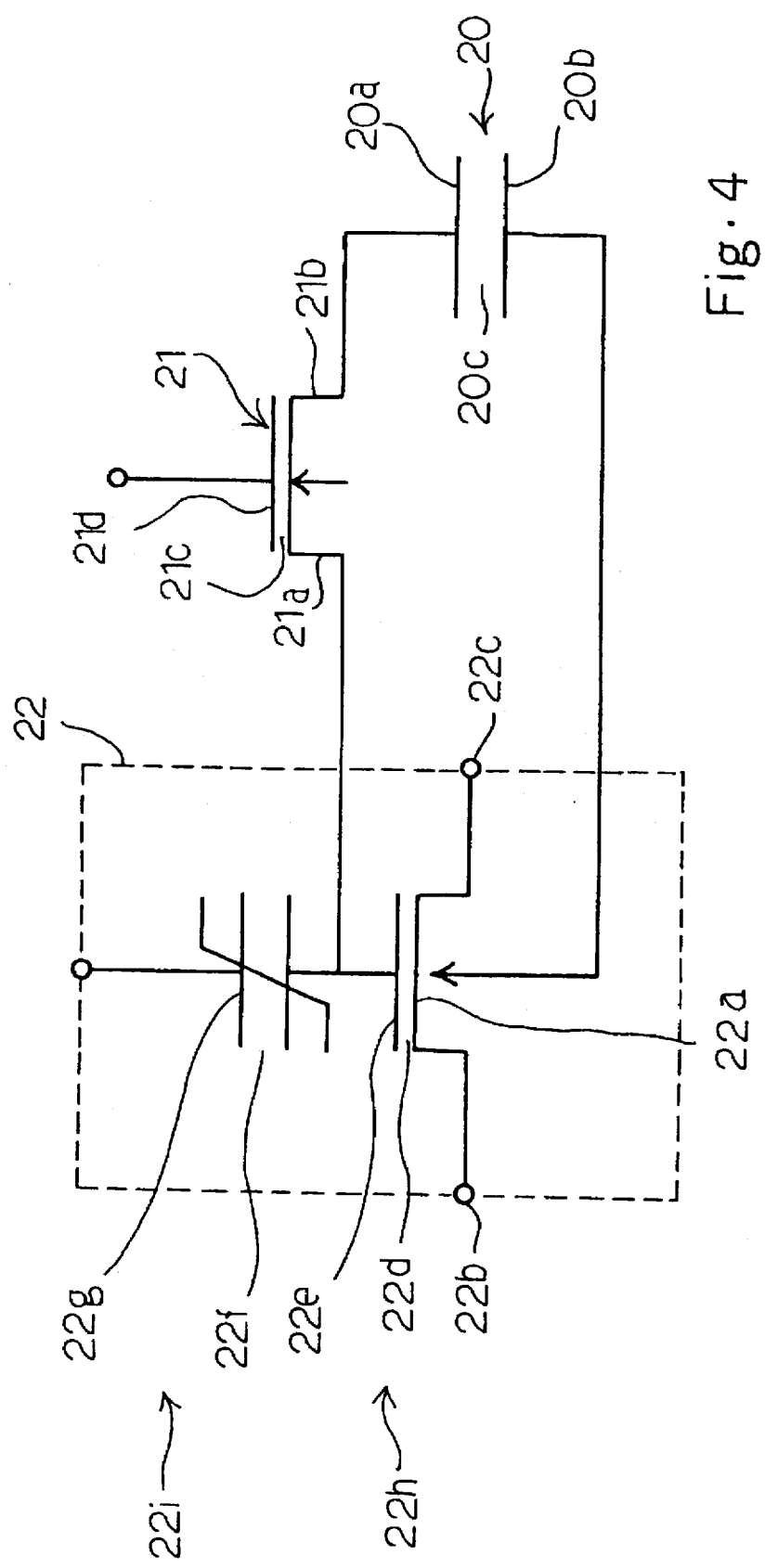
FIG. 4 is an equivalent circuit diagram showing a semiconductor non-volatile ferroelectric memory transistor according to the present invention.

Referring first to FIG. 4 of the drawings, a paraelectric capacitor 20 is connected in series to an n-channel enhancement type switching transistor 21, and the series combination of the paraelectric capacitor 20 and the n-channel enhancement type switching transistor 21 is connected at both ends thereof to a semiconductor non-volatile ferroelectric memory transistor 22. The paraelectric capacitor 20 has electrodes 20a and 20b and a dielectric film 20c of paraelectric material between the electrodes 20a and 20b.

A channel region 22a is formed between a source region 22b and a drain region 22c, and the channel region 22a is overlain by a lower insulating layer 22d of paraelectric material. A lower electrode 22e is provided on the lower insulating layer 22d, and an upper insulating layer 22f of ferroelectric substance is inserted between the lower electrode 22e and an upper electrode 22g. The channel region 22a, the lower insulating layer 22d and the lower electrode 22e form in combination a paraelectric capacitor 22h, and the lower electrode 22e, the upper insulating layer 22f and the upper electrode 22g as a whole constitute a ferroelectric capacitor 22i.

The lower electrode 22e is connected through the n-channel enhancement type switching transistor 21 to the electrode 20a of the paraelectric capacitor 20 and the channel region 22a is connected to the other electrode 20b. Thus, the paraelectric capacitor 20 is coupled in parallel to the paraelectric capacitor 22h of the semiconductor non-volatile ferroelectric memory transistor 22.

Figure 5:
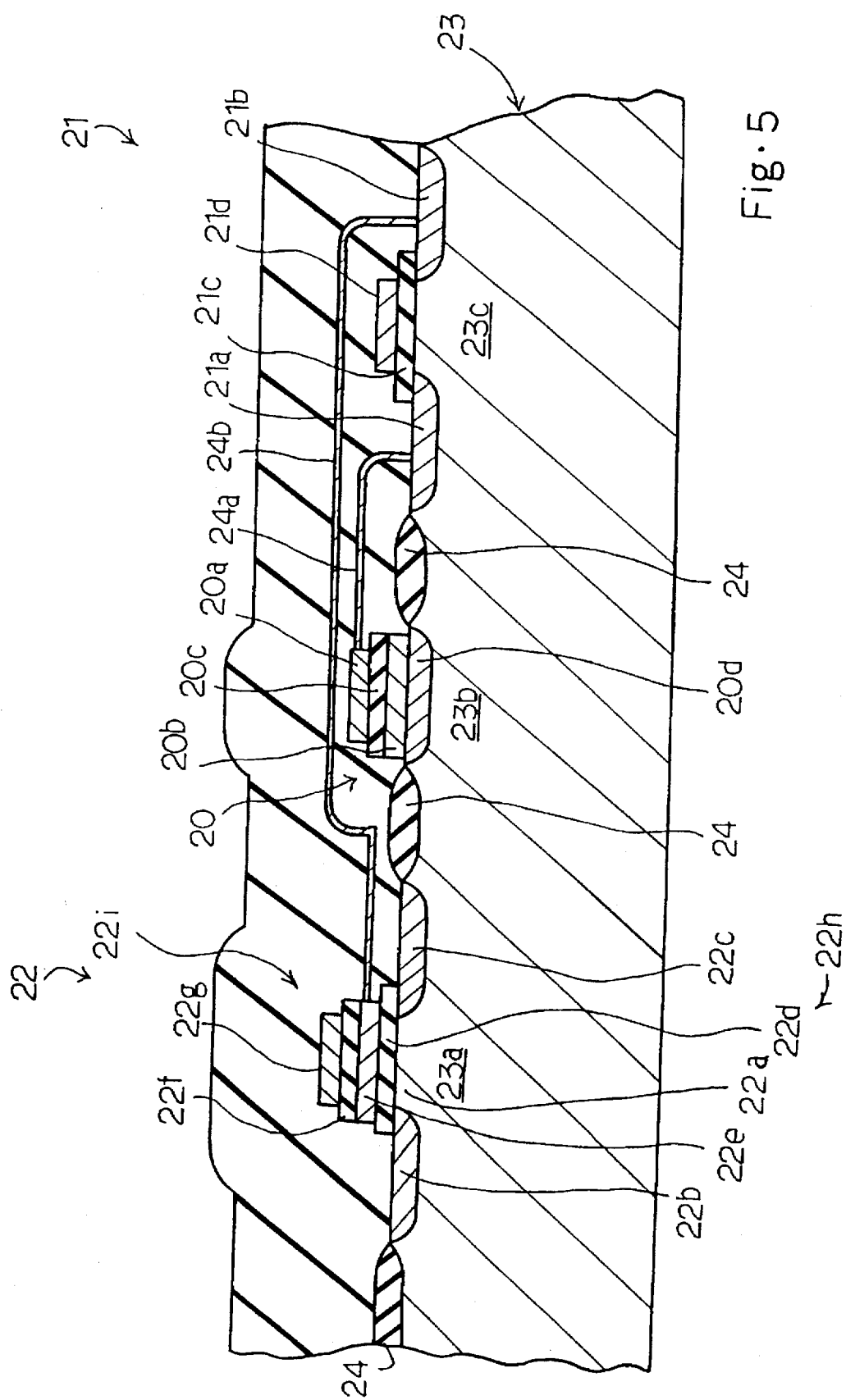
FIG. 5 is a cross sectional view showing the structure of the semiconductor non-volatile ferroelectric memory transistor according to the present invention.

The semiconductor non-volatile ferroelectric memory transistor 22, the n-channel enhancement type switching transistor 21 and the paraelectric capacitor 20 are fabricated on a single p-type semiconductor substrate 23 as shown in FIG. 5.

A field oxide layer 24 is selectively grown on the p-type semiconductor substrate 23, and defines active areas such as 23a, 23b and 23c. The active areas 23a, 23b and 23c are respectively assigned to the semiconductor non-volatile ferroelectric memory transistor 22, the paraelectric capacitor 20 and the n-channel enhancement type switching transistor 21.

In the active area 23a are introduced n-type dopant impurity which forms the n-type source region 22b and the n-type drain region 22c. The channel region 22a is formed between the n-type source region 22b and the n-type drain region 22c, and the channel region 22a is overlain by the lower insulating layer 22d of silicon dioxide. The silicon dioxide may be thermally grown, and the surface state of the channel region 22a is negligible. The lower electrode 22e is formed on the lower insulating layer 22d, and is formed of platinum. The lower electrode 22e is overlain by the upper insulating layer 22f of (Pb(Zr, Ti)O$_3$) which in tern is overlain by the upper electrode 22g of platinum.

The paraelectric capacitor 20 is formed in the active area 23b. Heavily doped p-type impurity region 20d is formed in the active area 23b, and the lower electrode 20b of platinum, the dielectric layer 20c of BaSrTiO$_3$ and the upper electrode 20a of platinum are laminated on the p-type impurity region 20d. BaSrTiO$_3$ has the relative permittivity of the order of 500. The heavily doped p-type impurity region 20d is electrically connected through the p-type semiconductor substrate 23 to the channel region of the semiconductor non-volatile ferroelectric memory transistor 22.

In the active area 23c, heavily doped n-type source/drain regions 21a and 21b are formed and spaced from each other. A gate insulating layer 21c is formed on a channel region between the heavily doped n-type source/drain regions 21a and 21b, and may be formed of silicon oxide. The gate insulating layer 21c is overlain by a gate electrode 21d, and the heavily-doped n-type source/drain regions 21a/21b, the gate insulating layer 21c and the gate electrode 21d as a whole constitute the n-channel enhancement type switching transistor 21.

The heavily-doped n-type source/drain region 21a is electrically connected through an interconnection 24a of WSI$_2$ to the upper electrode 20a of the paraelectric capacitor 20, and the other heavily-doped n-type source/drain region 21b is connected through an interconnection 24b of WSI$_2$ to the lower electrode 22e of the semiconductor non-volatile ferroelectric memory transistor 22. Thus, the paraelectric capacitor 20 is coupled in parallel to the paraelectric capacitor 22h of the semiconductor non-volatile ferroelectric memory transistor 22.

Figure 6:
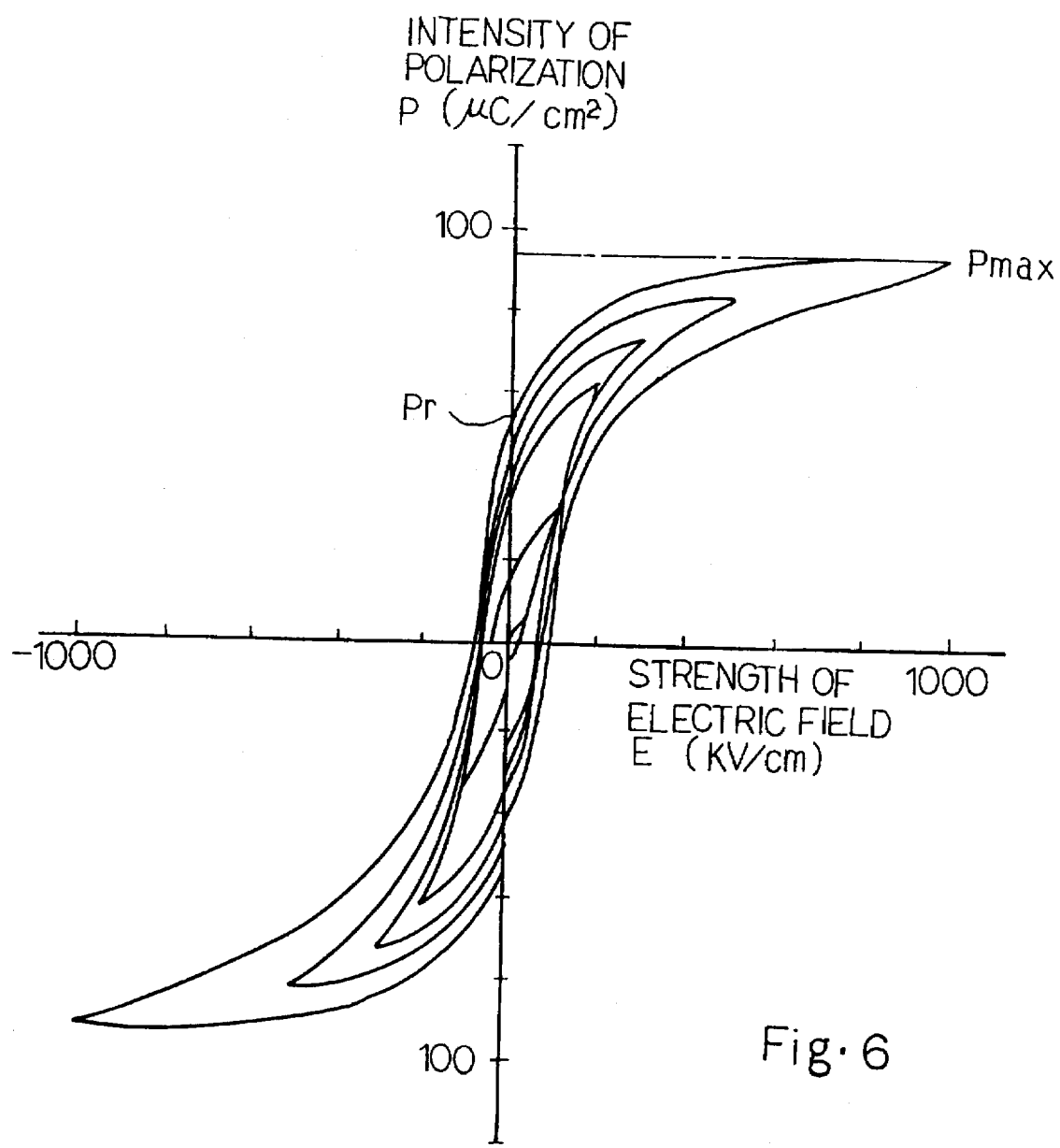
FIG. 6 is a graph showing polarization hysteresis measured in a ferroelectric capacitor incorporated in the semiconductor non-volatile ferroelectric memory transistor.

The present inventor measured the polarization hysteresis of the ferroelectric capacitor 22i, and the intensity of polarization P was plotted in terms of the strength of electric field E as shown in FIG. 6. It was understood from FIG. 6 that the maximum intensity of polarization Pmax and the remanence Pr, i.e., the intensity of polarization at E=0 were increased together with the strength of electric field E applied to the ferroelectric capacitor 22i.

Figure 7:
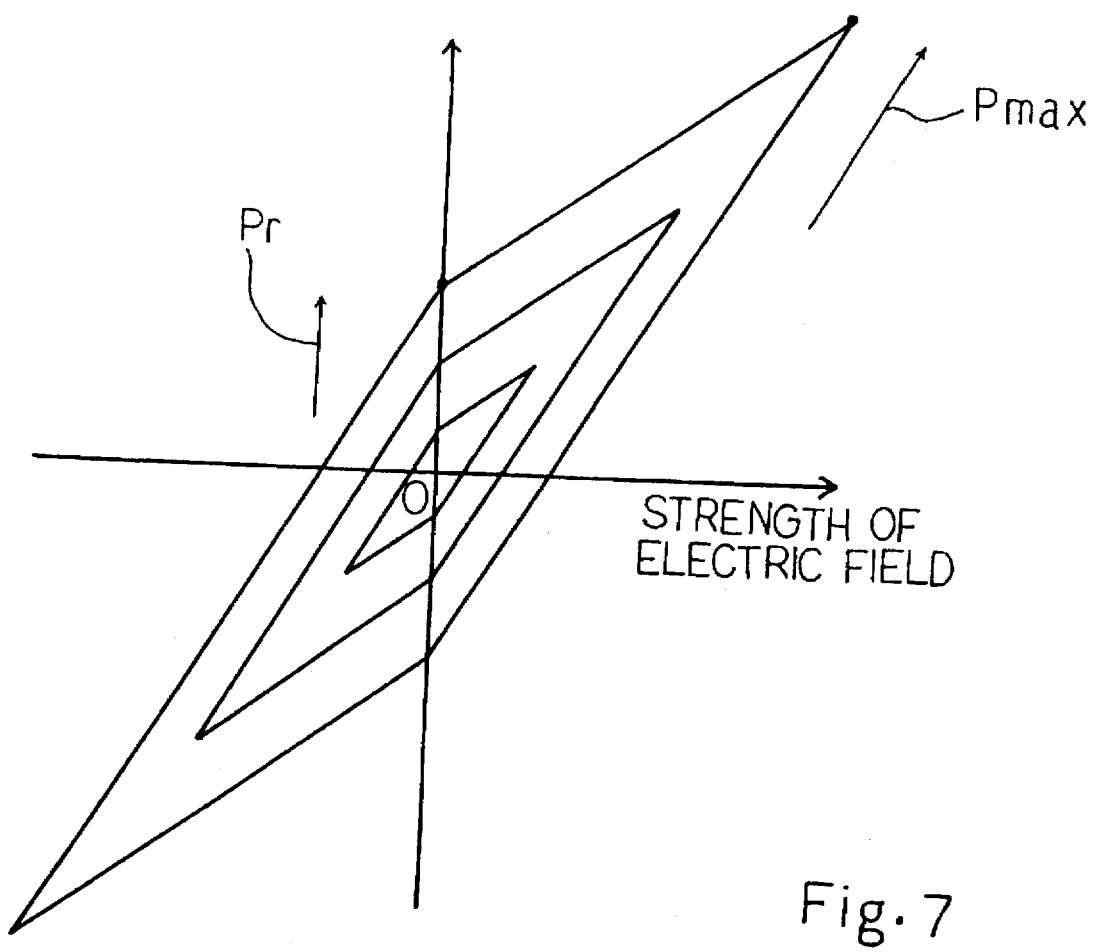
FIG. 7 is a graph showing a model of the polarization hysteresis for an analysis.

In order to easily analyze the polarization characteristics of the ferroelectric capacitor 22i, the polarization hysteresis is modeled as shown in FIG. 7. The maximum intensity of polarization Pmax is assumed to be proportional to the maximum strength of electric field E, and the remanence Pr is assumed to be increased at the same rate as the maximum intensity of polarization Pmax.

Figure 8:
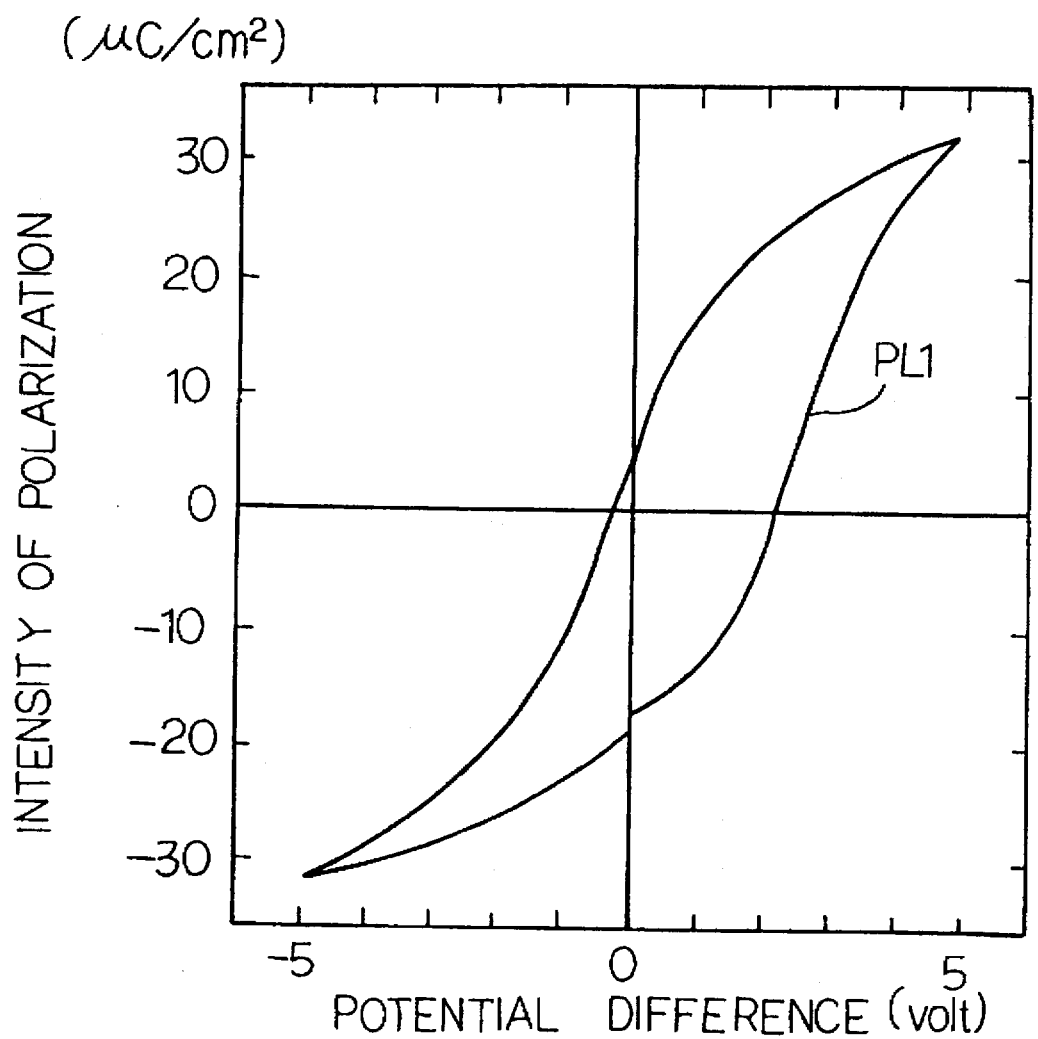
FIG. 8 is a graph showing the polarization hysteresis when the insulating layer of the ferroelectric capacitor is adjusted to 300 nanometers thick.

When the insulating layer 22f was adjusted to 300 nanometers thick, the polarization hysteresis was traced along plots PL1 in FIG. 8. From FIGS. 6 and 8, the intensity of polarization P in terms of the potential difference between the lower electrode 22e and the channel 22a was plotted as shown in FIG. 9.

Figure 9:
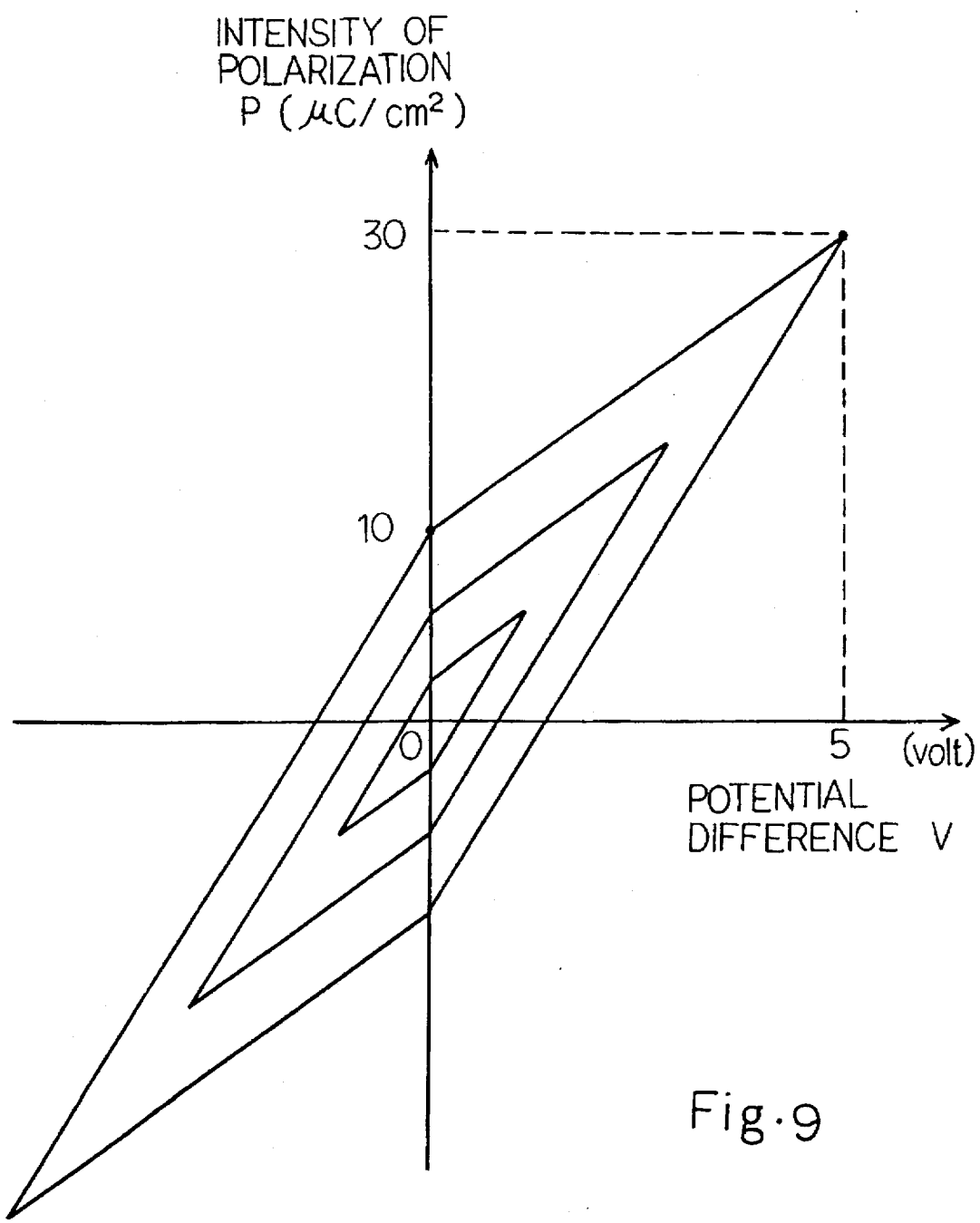
FIG. 9 is a graph showing the intensity of polarization in terms of a potential difference applied to the ferroelectric capacitor.

Assuming now that the polarization characteristics of the insulating layer 22f was represented by the hysteresis shown in FIG. 9, when the potential at the upper gate electrode 22g is changed from zero to a predetermined value and, thereafter, from the certain value to zero, the remanence Pr is increased from zero to a certain value. The increment or the certain value of the remanence Pr is calculated as follows.

The potential difference V is shared between the ferroelectric capacitor 22i and the paraelectric capacitors 20 and 22h, and the ferroelectric capacitor 22i and the paraelectric capacitors 20/22h are established in the following relation.

$$V = Vf + Vp \qquad \text{Equation 3}$$

where Vf is a part of the potential V applied to the ferroelectric capacitor 22i and Vp is the remaining part of the potential of the potential V applied to the paraelectric capacitors 20/22h. The surface are of the insulating layer 22f is assumed to be approximately equal to the surface area of the insulating layer 22d and the surface area of the insulating layer 20c. The amount of electric charge in the electrode on the insulating layer 22f is approximately equal to the total of the amount of electric charge in the electrodes of the paraelectric capacitors 20/22h. Equation 4 is obtained on the basis of FIG. 9.

$$(Cg+Cp)Vp = e0 Vf/df + P + P = 6\ Vf \qquad \text{Equation 4}$$

where df is the thickness of the upper insulating layer 22f in cm, P is the intensity of polarization of the upper insulating layer in micro-farad/cm$^2$, e0 is the permittivity in vacuum in F/cm, Cg is the gate capacitance (F/cm$^2$ and Cp is the capacitance of the paraelectric capacitor 20. From equations 3 and 4, we obtain the following equation.

$$Vf = V/(1+6\ (Cg+Cp)) = Vmax \qquad \text{Equation 5}$$

where Vmax is the maximum potential applied to the upper insulating layer 22f.

On the other hand, when the potential level at the upper gate electrode 22g is changed from V to zero, equations 6 and 7 are given from FIG. 9.

$$Vp + Vf = 0 \qquad \text{Equation 6}$$

$$8\ Vf+2\ Vmax=(Cg+Cp)\ Vp \qquad \text{Equation 7}$$

From equations 5, 6 and 7, we determine the potential difference Vf applied to the upper insulating layer 22f as follows.

$$Vf=-2Vmax/(8+Cg+Cp) \qquad \text{Equation 8}$$

When the potential level at the upper electrode 22g is zero, the remanence Pr in the ferroelectric insulating layer 22f is given by equation 9.

$$Pr=2V/(1+8/(Cg+Cp))/(1+6/(Cg+Cp)) \qquad \text{Equation 9}$$

From equation 9, it is understood that remanence Pr is decreased together with the total capacitance (Cg+Cp). In other words, if the total capacitance (Cg+Cp) is increased, the semiconductor non-volatile ferroelectric capacitor 22 is improved in the information storing characteristics.

Figure 1:
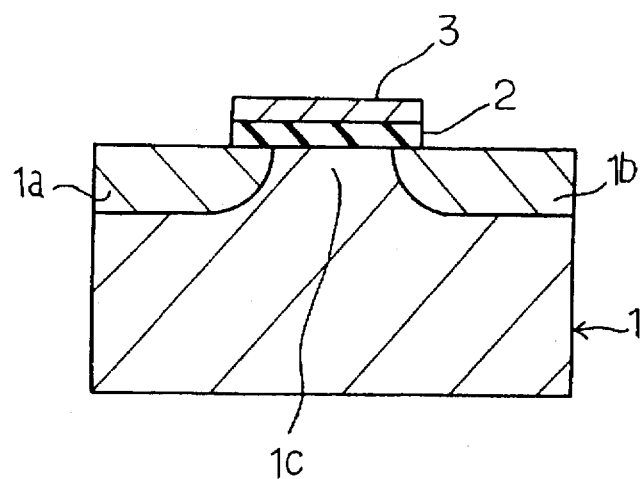
FIG. 1 is a cross sectional view showing the prior art semiconductor non-volatile ferroelectric memory transistor disclosed in Japanese Patent Publication of Unexamined Application No. 50-82973.
Figure 2:
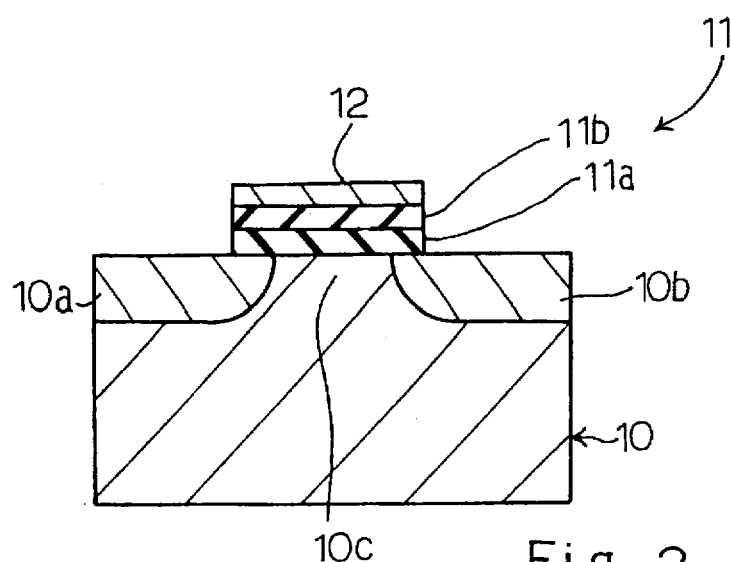
FIG. 2 is a cross sectional view showing the prior art semiconductor non-volatile ferroelectric memory transistor disclosed in Japanese Patent Publication of Unexamined Application No. 6-29549.
Figure 3:
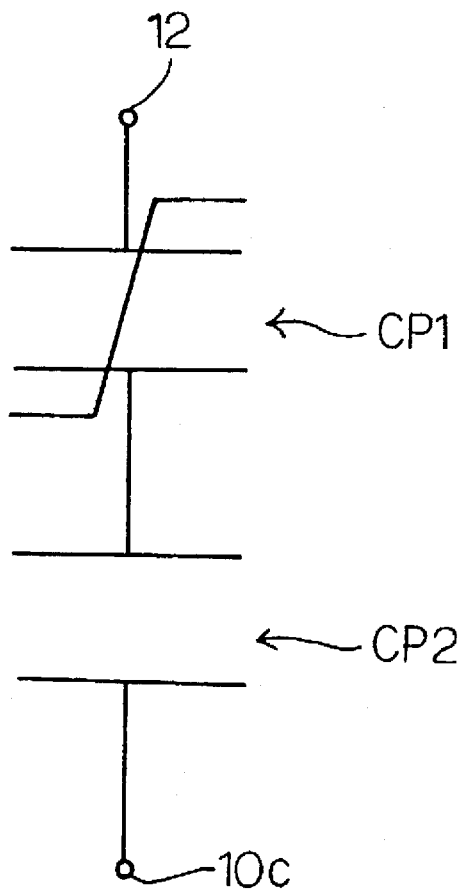
FIG. 3 is an equivalent circuit diagram showing the prior art semiconductor non-volatile ferroelectric memory transistor shown in FIG. 2.

Comparing the equivalent circuit shown in FIG. 4 with the prior art equivalent circuit shown in FIG. 1, the paraelectric capacitor 20 is newly coupled in parallel to the paraelectric capacitor 22h, and increases the total capacitance (Cp+Cg). This results in a large remanence Pr and, accordingly, improved information storing characteristics.

Figure 10:
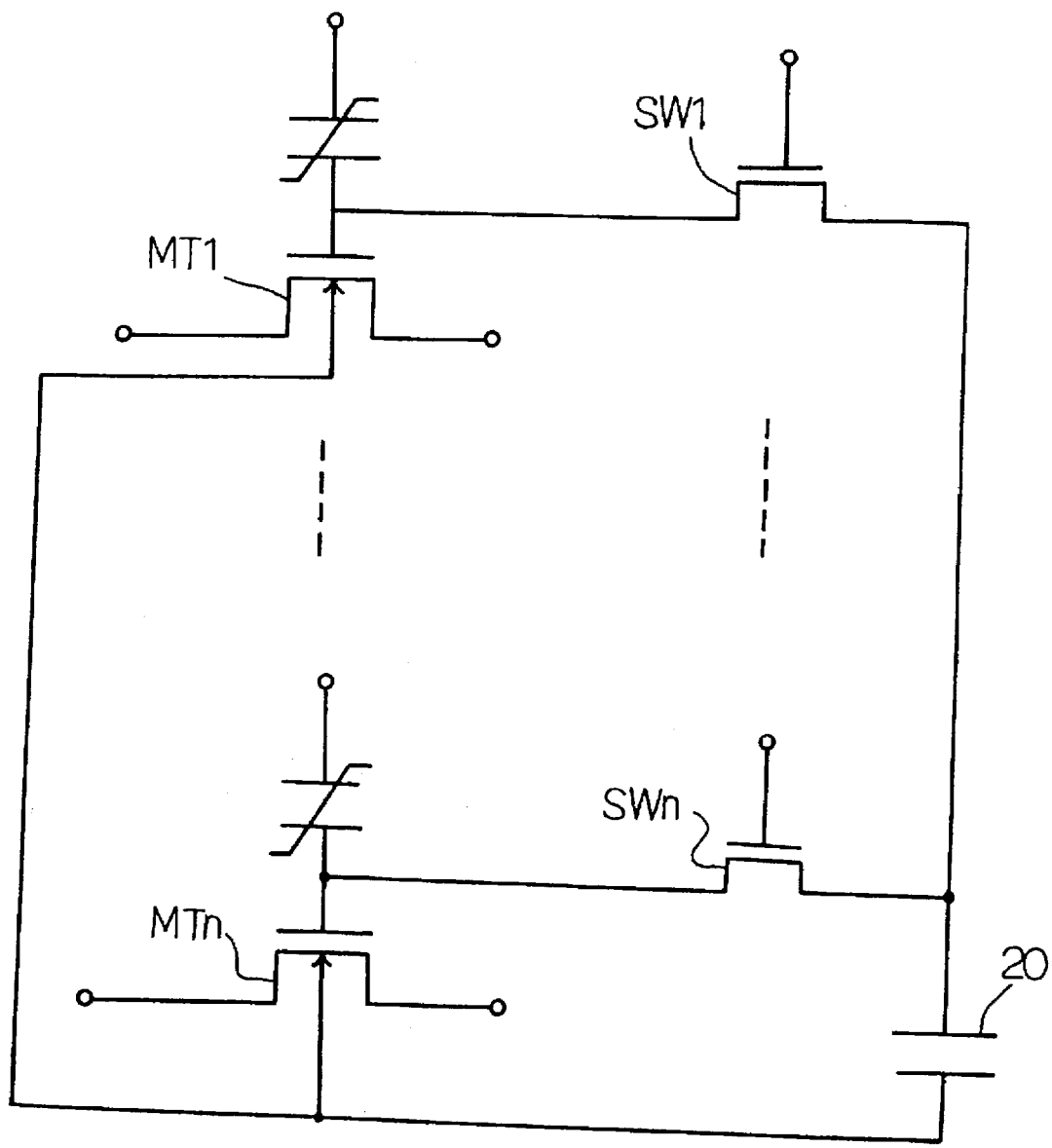
FIG. 10 is a circuit diagram showing a memory cell array formed from the semiconductor non-volatile ferroelectric memory transistors.

The paraelectric capacitor 20 may be shared between a plurality of semiconductor non-volatile ferroelectric memory transistors MT1 to MTn as shown in FIG. 10. In this instance, the n-channel enhancement type switching transistors SW1 to SWn are connected between the semiconductor non-volatile ferroelectric memory transistors MT1 to MTn and the paraelectric capacitor 20. The n-channel enhancement type switching transistors SW1 to SWn selectively turn on so as to connect the paraelectric capacitor 20 to the associated semiconductor non-volatile ferroelectric memory transistors MT1 to MTn. When a data bit is written into one of the semiconductor non-volatile ferroelectric memory transistors MT1 to MTn, the associated n-channel enhancement type switching transistor turns off, and another n-channel enhancement type switching transistor turns on so as to connect the associated semiconductor non-volatile ferroelectric memory transistor to the paraelectric capacitor 20. In this instance, additional area for the paraelectric capacitor 20 is negligible.

When a data bit is read out from the semiconductor non-volatile ferroelectric memory transistor 22, the associated n-channel enhancement type switching transistor 21 is turned off, and decreases the capacitance coupled to the upper electrode 22g. This results in a high-speed data read-out.

Subsequently, description is made on the maximum potential difference applied to the upper insulating layer 22f given by equation 5 in the presence of the paraelectric capacitor 20 and in the absence thereof on the assumption that the lower insulating layer 22d is 20 nanometers thick. The relative permittivity of silicon dioxide is 4, and the capacitance Cg at unit area is given by equation 10.

$$Cg=4\ e0/20\ e-7+0.2\ \text{micro-farad/cm}^2 \qquad \text{equation 10}$$

where e0 is the permittivity in vacuum.

If the paraelectric capacitor 20 is not connected to the semiconductor non-volatile ferroelectric capacitor 22h, the capacitance Cp is zero, and equation 5 gives 0.16 volt to the maximum potential difference Vmax in the presence of 5 volts at the upper electrode 22g.

On the other hand, if the paraelectric capacitor 20 is connected to the semiconductor non-volatile ferroelectric capacitor 22h, the capacitance Cg is calculated to be 0.2 micro-farad/cm² by equation 10. The upper insulating layer 22f is assumed to be equal in area to the lower insulating layer 22d, and the insulating layer 20c is equal in thickness to the upper insulating layer 22f. The relative permittivity of BaStTiO₃ is of the order of 500, and the capacitance Cp is 1.5 micro-farad/cm². Then, equation 5 gives 1.1 volts to the maximum potential difference Vmax applied to the upper insulating layer 22f in the presence of the potential of 5 volts at the upper electrode 22g. Thus, the paraelectric capacitor 20 increases the maximum potential difference Vmax from 0.16 volt to 1.1 volts, and improves the information storing characteristics of the semiconductor non-volatile ferroelectric memory transistor 22.

Even if the paraelectric capacitor 20 is not connected to the semiconductor non-volatile ferroelectric memory transistor 22, an increased capacitance Cg of the paraelectric capacitor 22h improves the information storing characteristics. The capacitance Cg is increased as follows:

i) the upper insulating layer 22f is decreased in area than the lower insulating layer 22d or, alternatively, the lower insulating layer 22d is increased in area than the upper insulating layer, ii) the lower insulating layer 22d is decreased in thickness than the upper insulating layer 22f, iii) silicon dioxide is changed to insulating material with larger relative permittivity.

However, these approaches are less feasible. The lithographic techniques set a limit to the reduction in area of the upper insulating layer 22f, and a wide lower insulating layer 22d decreases an integration density of the semiconductor non-volatile ferroelectric memory transistors on a single semiconductor chip. The second approach deteriorates the reliability of the lower insulating layer 22d, and reduces the production yield. The third approach hardly finds suitable insulating material. Only silicon oxide and silicon nitride are presently available for a gate insulating layer without increasing the surface state. If the lower insulating layer 22d is formed of other insulating material, the semiconductor non-volatile ferroelectric memory transistor suffers from a large amount of surface state. On the other hand, the paraelectric capacitor 20 according to the present invention is free from the problems encountered in the approaches i), ii) and iii), and improves the data storing characteristics of the semiconductor non-volatile ferroelectric memory transistor.

As will be appreciated from the foregoing description, the paraelectric capacitor coupled in parallel to the paraelectric capacitor 20 increases the capacitance of the paraelectric capacitor 22h without increase of the surface state of the semiconductor non-volatile ferroelectric memory transistor, and the increased capacitance enlarges the potential difference applied across the ferroelectric layer. The enlarged potential difference increases the remanence, and the increased remanence improves the information storing characteristics of the semiconductor non-volatile ferroelectric memory transistor.

The n-channel enhancement type switching transistor 21 is turned off during a data read-out, and does not deteriorate the semiconductor non-volatile ferroelectric memory transistor in the data access speed.

Although a particular embodiment of the present invention has been shown and described, it will be obvious to those skilled in the art that various changes and modifications may be made without departing from the spirit and scope of the present invention.

For example, the paraelectric capacitor 20 may be directly connected to the lower gate electrode of the semiconductor non-volatile ferroelectric memory transistor without the n-channel enhancement type switching transistor 21. In this instance, the semiconductor non-volatile ferroelectric memory transistors are respectively accompanied with the paraelectric capacitors 20.

The lower gate insulating layer 22d may be formed of silicon nitride.

What is claimed is:

1. A semiconductor non-volatile ferroelectric memory cell fabricated on a semiconductor substrate, comprising:

a memory transistor including source and drain regions formed on both sides of a channel region, a lower gate insulating layer formed of paraelectric material on said channel region, a lower gate electrode laminated on said lower gate insulating layer, an upper gate insulating layer formed of ferroelectric material on said lower gate electrode and an upper gate electrode formed on said upper gate insulating layer, and storing a data bit in the form of remanence in said upper gate insulating layer; and a paraelectric capacitor including a lower electrode electrically connected to said channel region, an insulating layer formed of paraelectric material on said lower electrode and an upper electrode electrically connected to said lower gate electrode of said memory transistor.

2. The semiconductor non-volatile ferroelectric memory cell as set forth in claim 1, in which said paraelectric material for said insulating layer of said paraelectric capacitor is larger in relative permittivity than said paraelectric material for said lower gate insulating layer of said memory transistor.

3. The semiconductor non-volatile ferroelectric memory cell as set forth in claim 2, in which said paraelectric material for said insulating layer is expressed by the chemical formula of $BaSrTiO_3$, and said paraelectric material for said lower gate insulating layer is selected from the group consisting of silicon oxide and silicon nitride.

4. The semiconductor non-volatile ferroelectric memory cell as set forth in claim 1, further comprising a switching transistor providing an electric path between said upper electrode of said paraelectric capacitor and said lower gate electrode of said memory transistor during a data write-in.

5. The semiconductor non-volatile ferroelectric memory cell as set forth in claim 4, in which said switching transistor is turned off during a data read-out.

6. The semiconductor non-volatile ferroelectric memory cell as set forth in claim 4, in which said paraelectric capacitor is shared between said memory transistor and another memory transistor identical in structure to said memory transistor, and is connected through another switching transistor to a lower gate electrode of said another memory transistor during a data write-in to said another memory transistor.

7. The semiconductor non-volatile ferroelectric memory cell as set forth in claim 6, in which said another switching transistor is turned off during a data read-out from said another memory transistor.

8. A semiconductor non-volatile ferroelectric memory cell comprising:

a field effect transistor fabricated on a semiconductor substrate;

a ferroelectric capacitor having a first electrode and a second electrode connected to a gate electrode of said field effect transistor; and a paraelectric capacitor having a third electrode connected to said semiconductor substrate and a fourth electrode connected to said gate electrode of said field effect transistor so as to be coupled in parallel to a gate insulating capacitor of said field effect transistor.

* * * * *